(12) United States Patent
Westerlund

(10) Patent No.: US 9,673,614 B2
(45) Date of Patent: Jun. 6, 2017

(54) MONITORING DEVICE AND SURGE ARRESTER SYSTEM

(71) Applicant: ABB Schweiz AG, Baden (CH)

(72) Inventor: Håkan Westerlund, Svärdsjö (SE)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/028,826

(22) PCT Filed: Oct. 15, 2013

(86) PCT No.: PCT/EP2013/071529
§ 371 (c)(1),
(2) Date: Apr. 12, 2016

(87) PCT Pub. No.: WO2015/055233
PCT Pub. Date: Apr. 23, 2015

(65) Prior Publication Data
US 2016/0261106 A1    Sep. 8, 2016

(51) Int. Cl.
*H02H 3/22*    (2006.01)
*H02H 9/04*    (2006.01)
(Continued)

(52) U.S. Cl.
CPC .......... *H02H 3/22* (2013.01); *G01R 31/1236* (2013.01); *H02H 3/04* (2013.01); *H02H 9/042* (2013.01); *H02H 3/048* (2013.01)

(58) Field of Classification Search
CPC ......... H92H 3/22; G01R 31/1236; H02H 9/22
(Continued)

(56) References Cited

U.S. PATENT DOCUMENTS 4,796,283 A    1/1989    Brunner et al.
4,973,929 A  * 11/1990    Duchemin ............. H01H 89/08
                                                335/132
(Continued)

FOREIGN PATENT DOCUMENTS

EP    1191561 A1    3/2002
EP    2333925 A1    6/2011

OTHER PUBLICATIONS

International Preliminary Report on Patentability Application No. PCT/EP2013/071529 Mailing Date: Sep. 30, 2015 5 pages.
(Continued)

*Primary Examiner* — Scott Bauer
(74) *Attorney, Agent, or Firm* — Whitmyer IP Group LLC

(57) ABSTRACT

A device for monitoring a surge arrester, including: a grounding line; a measuring unit including one or more analog measuring circuits for measuring the electric current passing through the grounding line; an electronic processing unit for receiving measuring signals from the measuring circuits; a data storage medium for storing monitoring data produced by the processing unit; a base module, which accommodates the grounding line and the measuring unit; and an auxiliary module, which accommodates the processing unit and the data storage medium and is detachably mountable to the base module. When the auxiliary module is mounted to the base module, the components of the modules are connected to each other through a connector member provided on the base module and a corresponding connector member provided on the auxiliary module.

15 Claims, 3 Drawing Sheets

(51) Int. Cl.
*G01R 31/12* (2006.01)
*H02H 3/04* (2006.01)

(58) Field of Classification Search
USPC .......................................................... 361/118
See application file for complete search history.

(56) References Cited

U.S. PATENT DOCUMENTS

| | | |
|---|---|---|
| 5,841,616 A | 11/1998 | Crosier |
| 6,018,451 A | 1/2000 | Lyke et al. |
| 6,184,762 B1 | 2/2001 | Reiss et al. |
| 7,005,863 B2 | 2/2006 | Gudmundsson et al. |
| 7,859,811 B2 | 12/2010 | Tripathi |
| 7,974,064 B2 | 7/2011 | Shah et al. |

OTHER PUBLICATIONS

International Search Report Application No. PCT/EP2013/071529 Completed: Jun. 12, 2014;Mailing Date: Jul. 1, 2014 4 pages.
Written Opinion of the International Searching Authority Application No. PCT/EP2013/071529 Completed: Jun. 12, 2014;Mailing Date: Jul. 1, 2014 5 pages.

* cited by examiner

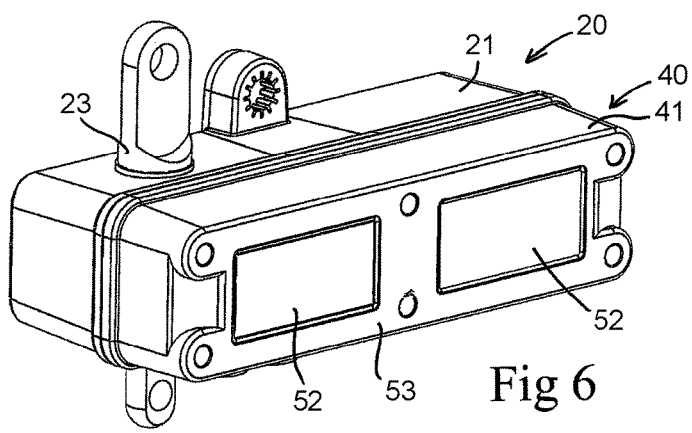
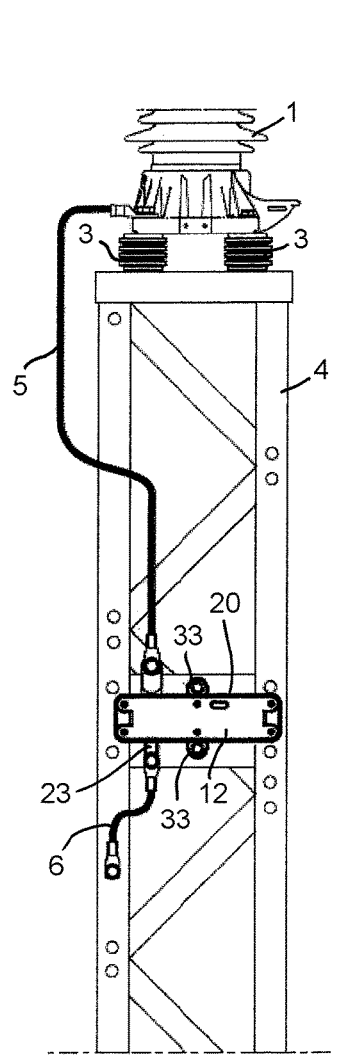
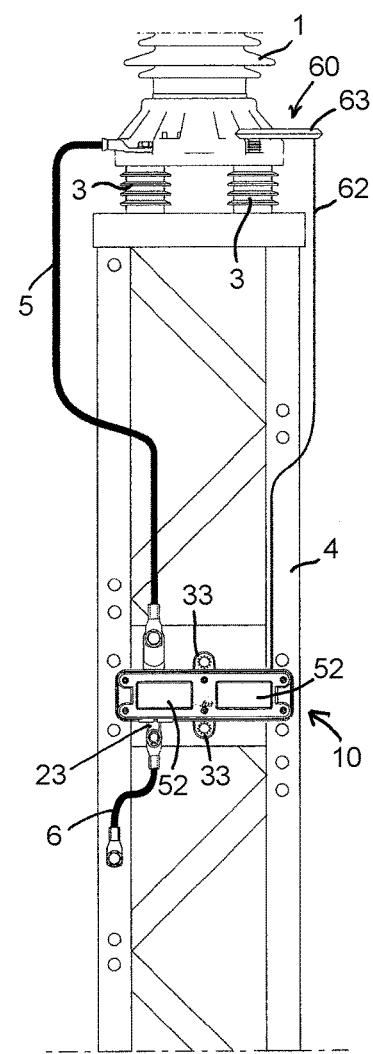
Fig 6
Fig 7
Fig 8

MONITORING DEVICE AND SURGE ARRESTER SYSTEM

TECHNICAL FIELD

The present invention relates to a monitoring device according to the invention for monitoring a surge arrester connected to a power network. The invention also relates to a surge arrester system comprising a surge arrester connected to a power network.

BACKGROUND

Unscheduled shutdowns in a power network normally cause a large loss of income to the network operator. When a shutdown is caused by damaged or malfunctioning network components, there will also be additional costs for the replacement and/or repair of said network components. Different types of surge arresters are today used in switchgears in order to protect equipment against incoming overvoltages. A surge arrester is connected between a live wire and ground and may be designed as a gapless surge arrester with series connected zinc oxide varistors. When the voltage level gets too high in the live wire, the surge arrester will allow the electric current to be conducted to ground, whereby the overvoltage is reduced.

The number of overvoltages a surge arrester is subjected to may be recorded by means of a so-called surge counter, which is connected to the grounding cable of the surge arrester. The surge counter gives information about the extent to which the installation is subjected to overvoltages and serves as a monitoring device for the surge arrester. An exceptional number of recorded overvoltages during a certain period of time indicates that the surge arrester should be inspected and possibly subjected to maintenance. A surge counter is normally provided with a relay that counts the number of surges passing through the surge arrester. The surge counter is normally sensitive to the charge content or amplitude of the impulse current through the surge arrester caused by the overvoltage and the counting function is activated when certain predetermined values with respect to the amplitude and/or duration of an electric current pulse are exceeded. A surge counter often has a display which shows the number of recorded surges.

If a porcelain housed surge arrester is subjected to severe pollution, the surge arrester might be partially heated due to transient variations in the voltage distribution caused by external soiling of the casing of the surge arrester. In such a case, the casing of the surge arrester should be cleaned. The layer of soil accumulated on the casing contains conductive and semiconductive particles, which cause a leakage current to flow through the casing. The leakage current flowing through the casing will be included in the total leakage current through the surge arrester. A sudden increase of the total leakage current through the surge arrester indicates that the casing has been soiled and needs to be cleaned. Monitoring devices comprising means for the combined recording of total leakage current through a surge arrester and surge counting have therefore come into use.

In a zinc oxide surge arrester, the varistors are continuously subjected to an operating voltage which causes a continuous electric current in the order of 1 mA to flow through the surge arrester. This electric current is under normal operating conditions essentially capacitive but does also contain a smaller resistive component. It is only changes in the resistive current component that can indicate possible changes in the characteristics of the surge arrester. Zinc oxide surge arresters have a very long service life, but its varistor blocks may undergo a slow deterioration resulting in a gradual increase of the resistive leakage current. When the resistive leakage current has increased to a certain level, there is a risk that a thermal racing process occurs, which results in the destruction of the varistor blocks. It is therefore of interest to check the resistive leakage current through the surge arrester. This may be done by means of a so-called field probe. The field probe is intended to pick up the electric field from the power network to which the surge arrester is connected. Based on measuring values related to the electric current flowing between the field probe and ground and measuring values related to the electric current flowing between the surge arrester and ground, the resistive leakage current of the surge arrester can be calculated with a specific method of calculation, the so-called Method B2 ("Third order harmonic analysis with compensation for harmonics in voltage" (Amendment 1, Section 6 IEC 60099-5)), as described in U.S. Pat. No. 7,005,863 B2.

SUMMARY

The object of the present invention is to achieve a surge arrester monitoring device of new and favourable design, which in at least some aspect offers an advantage as compared to previously known surge arrester monitoring devices.

According to the invention, said object is achieved by means of a monitoring device having the features defined in the invention.

The monitoring device of the present invention comprises:
  a grounding line, which is configured to be electrically connected to ground and to a surge arrester so that an electric current flowing through the surge arrester will pass through this grounding line;
  a measuring unit comprising one or more analog measuring circuits for measuring the electric current passing through the grounding line and producing measuring signals related to the measured electric current;
  an electronic processing unit for receiving said measuring signals from the measuring circuits of the measuring unit and producing monitoring data based on these measuring signals; and
  a data storage medium for storing monitoring data produced by the electronic processing unit,
wherein:
  the monitoring device comprises a base module and an auxiliary module detachably mountable to the base module;
  the grounding line and the measuring unit are arranged in the base module;
  the electronic processing unit and the data storage medium are arranged in the auxiliary module;
  the base module comprises a first connector member, which is connected to the measuring unit; and
  the auxiliary module comprises a second connector member, which is connected to the electronic processing unit, the second connector member being configured to be engaged with the first connector member when the auxiliary module is mounted to the base module to thereby allow the electronic processing unit to receive said measuring signals from the measuring unit via the first and second connector members.

The analog measuring circuits normally used for measuring electric currents in a surge arrester monitoring device are of a robust type and may be in operation for several years without requiring any maintenance or upgrade. However, the electronic processing unit used in a surge arrester monitoring device for processing the measuring signals from the analog measuring circuits comprises more advanced digital electronics, which is more sensitive and could require regular maintenance or replacement. Also the data storage medium used for storing the monitoring data produced by the electronic processing unit is more sensitive and requires regular maintenance or replacement. According to the invention, said robust analog measuring circuits and said sensitive electronic processing unit and data storage medium are arranged in two different modules, which are easily connectable to each other and disconnectable from each other. The base module comprising the analog measuring circuits may remain connected to the surge arrester when the auxiliary module comprising the electronic processing unit and the data storage medium is disconnected from the base module and thereby from the surge arrester. Hereby, the auxiliary module may be temporarily detached from the base module in order to allow maintenance or replacement of the sensitive components in the auxiliary module, without requiring any interruption of the power distribution in the power network to which the surge arrester is connected. Thus, the maintenance and repair of the modularized surge arrester monitoring device of the present invention can be performed in a simpler, quicker, safer and more cost-efficient manner as compared to the maintenance and repair of a non-modularized surge arrester monitoring device of previously known type. A further advantage with the modularized surge arrester monitoring device of the present invention is that the electronic processing unit included in the auxiliary module of the monitoring device may be upgraded in a simple, quick, safe and cost-efficient manner, without requiring any interruption of the power distribution in the power network to which the surge arrester is connected. By combining one type of base module with different types of auxiliary modules, it will also be possible to provide monitoring devices of different configurations at a comparatively low cost and the monitoring devices can thereby be adapted to the requirements of the power network operator in a simple and cost-efficient manner.

According to an embodiment of the invention, the measuring unit comprises an analog measuring circuit, here denominated first measuring circuit, for detecting an electric current pulse of a predetermined magnitude in the grounding line and producing a measuring signal representing such a current pulse. Said first measuring circuit preferably comprises an inductive sensing member for sensing the electric current passing through the grounding line, this sensing member comprising a coil arranged around the grounding line. Current pulses through the surge arrester are caused by overvoltages in the power network to which the surge arrester is connected. By recording the number of current pulses passing through the surge arrester, it will consequently be possible to get information about the number of overvoltages occurring in the power network.

According to another embodiment of the invention, the base module comprises a counter mechanism for recording and displaying the number of current pulses detected by the first measuring circuit, the counter mechanism being actuated under the effect of the electric charge of the detected current pulses. By means of this counter mechanism, the base module may be used for recording and displaying the number of detected current pulses also when no auxiliary module is mounted to the base module and without requiring any supply of electric energy from a power supply unit.

According to another embodiment of the invention, the measuring unit comprises an analog measuring circuit, here denominated second measuring circuit, for measuring the leakage current of the surge arrester and producing measuring signals representing the measured leakage current. Said second measuring circuit preferably comprises an inductive sensing member for sensing the electric current passing through the grounding line, this sensing member comprising a coil arranged around the grounding line.

According to another embodiment of the invention, the electronic processing unit is configured to produce monitoring data representing the leakage current measured by the second measuring circuit, the data storage medium being configured to store this monitoring data.

Another embodiment of the invention is characterized in:
that the monitoring device comprises a field probe, which is configured to generate an electric current under the influence of the electric field of the power network to which the surge arrester is connected;
that the monitoring device comprises a measuring circuit, here denominated third measuring circuit, for measuring the electric current generated by the field probe and producing measuring signals representing the measured electric current;
that the electronic processing unit is configured to produce monitoring data representing the electric current measured by the third measuring circuit; and
that the data storage medium is configured to store the monitoring data representing the leakage current measured by the second measuring circuit and the monitoring data representing the electric current measured by the third measuring circuit associated to time information generated by means of a clock circuit included in the auxiliary module or received from an external clock circuit.

Hereby, it will be possible to use the data stored in the data storage medium in order to calculate the resistive leakage current through the surge arrester.

According to another embodiment of the invention, the field probe is provided in a separate field probe module, which is connected to the base module or the auxiliary module by means of an electric cable. Hereby, the field probe may be located at a distance from the base module and the auxiliary module. The field probe has to be located at a place where the electric field from the power network is sufficiently strong and may for instance be mounted close to the base of the surge arrester. Hereby, the field probe will normally be located rather high above the ground where it might be out of reach for a person standing on the ground. By allowing the base module and auxiliary module to be located at a distance from the field probe module, the base module and auxiliary module may be mounted closer to ground within convenient reach for a person standing on the ground. The maintenance of the monitoring device is thereby facilitated.

According to another embodiment of the invention, the auxiliary module comprises a temperature sensor for measuring the ambient temperature, the data storage medium being configured to store temperature information generated by means of the temperature sensor associated to time information generated by means of the clock circuit. Hereby, it will be possible, in connection with the calculation of the resistive leakage current through the surge arrester, to take into account the influence of the temperature on the measuring values from said second and third measuring circuits.

Further advantages as well as advantageous features of the monitoring device according to the invention will appear from the following description and the dependent claims.

The invention also relates to a surge arrester system according to the invention, which comprises a surge arrester connected to a power network and a modularized monitoring device of the above-mentioned type, wherein a first end of the grounding line included in the base module of the monitoring device is electrically connected to the surge arrester and an opposite second end of the grounding line is electrically connected to ground so that an electric current flowing from the power network to ground via the surge arrester will pass through the grounding line.

Further advantages as well as advantageous features of the system according to the invention will appear from the following description and the dependent claims.

BRIEF DESCRIPTION OF THE DRAWINGS

The invention will in the following be more closely described by means of embodiment examples, with reference to the enclosed drawings. In the drawings:

FIG. 6 is a perspective view of the base module and auxiliary module of FIGS. 4 and 5, with the auxiliary module mounted to the base module, FIG. 7 is a front view of the base module of FIG. 2 mounted to the stand of a surge arrester, and FIG. 8 is a front view of a monitoring device comprising the base module and auxiliary module of FIGS. 4-6 mounted to the stand of a surge arrester.

DETAILED DESCRIPTION

Figure 1:
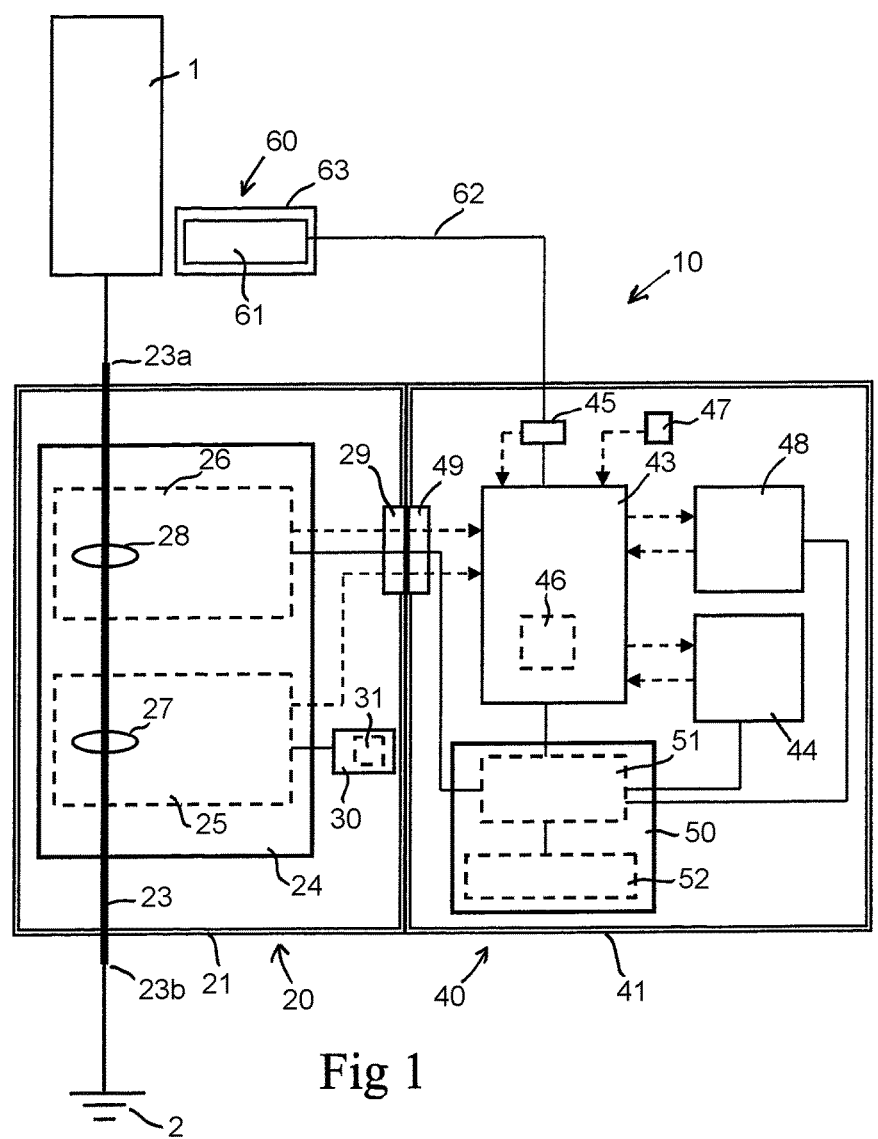
FIG. 1 is an outline diagram of a monitoring device according to an embodiment of the present invention.

FIG. 1 very schematically illustrates a monitoring device 10 according to an embodiment of the present invention. The monitoring device 10 is to be connected to a surge arrester 1 in order to record monitoring data related to the operation and condition of the surge arrester. The surge arrester 1 is connected to a power network in a conventional manner and is a gapless surge arrester provided with several series connected zinc oxide varistors.

Figure 4:
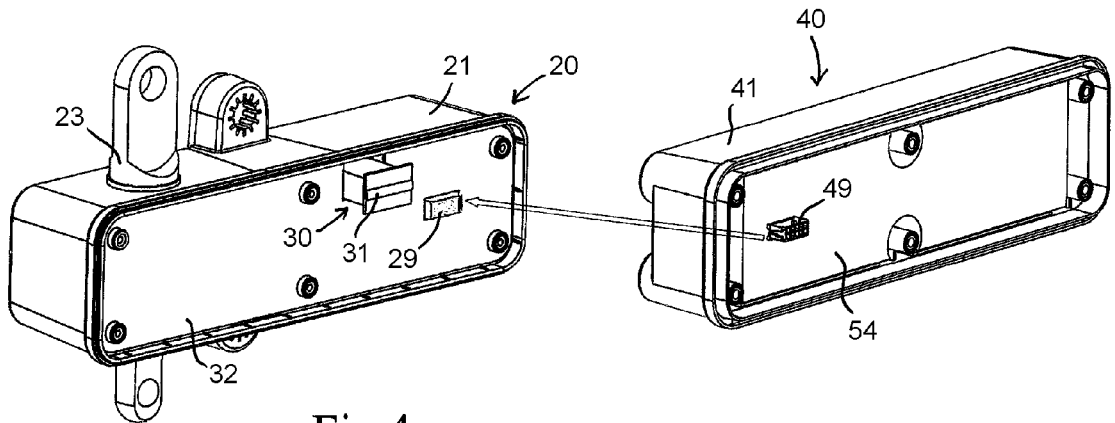
FIG. 4 is a perspective view of the base module of FIG. 2 and an auxiliary module, with the modules separated from each other.
Figure 5:
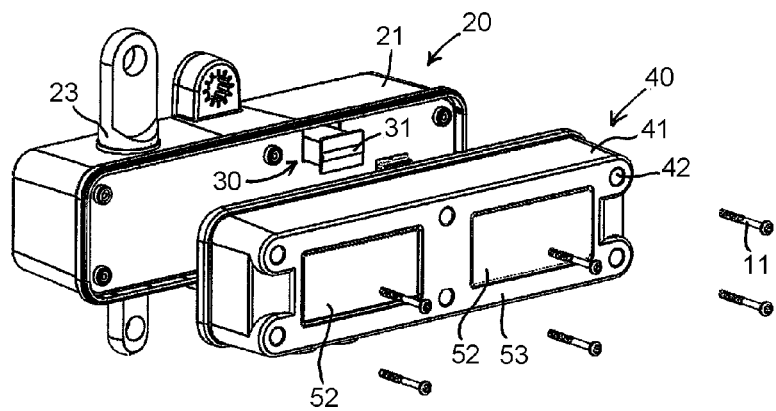
FIG. 5 is another perspective view of the base module and auxiliary module of FIG. 4.

The monitoring device 10 comprises a base module 20 and an auxiliary module 40, the auxiliary module being detachably mountable to the base module. Each module 20, 40 comprises an external casing 21, 41, which accommodates different components of the monitoring device 10. In the example illustrated in FIGS. 4-6, the casing 41 of the auxiliary module 40 is securable to the casing 21 of the base module 20 by means of fastening members 11 in the form of screws. In the assembled state, each fastening member 11 extends through a through hole 42 in the casing 41 of the auxiliary module 40 and has an inner threaded end engaged in a threaded hole 22 in the casing 21 of the base module 20.

The auxiliary module 40 may of course also be detachably mountable to the base module 20 in any other suitable manner.

The base module 20 comprises a grounding line 23, which extends through the casing 21 of the base module. The grounding line 23 is to be electrically connected to ground 2 and to the surge arrester 1. When the monitoring device 10 is connected to the surge arrester 1, a first end 23a of the grounding line 23 is electrically connected to the surge arrester 1 and an opposite second end 23b of the grounding line is electrically connected to ground 2 so that an electric current flowing from the power network to ground via the surge arrester 1 will pass through the grounding line 23. The grounding line 23 is with advantage designed as a stiff rod of a suitable metallic material and rigidly secured to the casing 21 of the base module 20, as illustrated in FIGS. 2-6.

The base module 20 also comprises a measuring unit 24, which is arranged in the casing 21 of the base module and which comprises one or more analog measuring circuits 25, 26 for measuring the electric current passing through the grounding line 23 and producing measuring signals related to the measured electric current. In the illustrated embodiment, the measuring unit 24 comprises a first analog measuring circuit 25 for detecting an electric current pulse of a predetermined magnitude in the grounding line 23 and producing a measuring signal representing such a current pulse, and a second analog measuring circuit 26 for measuring the leakage current of the surge arrester 1 and producing measuring signals representing the measured leakage current. Each measuring circuit 25, 26 preferably comprises an inductive sensing member 27, 28 for sensing the electric current passing through the grounding line 23, wherein the sensing member 27, 28 of the respective measuring circuit comprises a coil arranged around the grounding line 23.

The inductive sensing member 27 of said first measuring circuit 25 may comprise a coil consisting of a winding arranged around an iron core, wherein said winding is connected to a capacitor which is charged by the current induced in the winding. When the voltage across the capacitor exceeds a predetermined threshold value, the capacitor is discharged and a measuring signal is emitted from the first measuring circuit 25. It is of course also possible to design the first measuring circuit 25 in other ways than here described.

The inductive sensing member 28 of said second measuring circuit 26 may also comprise a coil consisting of a winding arranged around an iron core.

The auxiliary module 40 comprises an electronic processing unit 43 for receiving the measuring signals from the measuring circuits 25, 26 of the measuring unit 24 and producing monitoring data based on these measuring signals. The electronic processing unit 43 is configured to produce monitoring data representing the current pulses detected by the first measuring circuit 25 and monitoring data representing the leakage current measured by the second measuring circuit 26. The auxiliary module 40 also comprises a data storage medium 44 for storing the monitoring data produced by the electronic processing unit 43. Input and writing of data in the data storage medium 44 is controlled by the electronic processing unit 43. The data storage medium 44 is for instance a memory of the type ROM, PROM, EPROM or EEPROM. The electronic processing unit 43 is also responsible for the control of other components included in the monitoring device 10.

The electronic processing unit 43 may be configured to produce monitoring data related to the amplitude of each current pulse detected by the first measuring circuit 25 based on measuring values related to the voltage across the above-mentioned capacitor of the first measuring circuit.

The electronic processing unit 43 is connected to the measuring circuits 25, 26 via a connector which comprises a first connector member 29 provided in the base module 20 and a second connector member 49 provided in the auxiliary module 40. The first connector member 29 is connected to the measuring circuits 25, 26 of the measuring unit 24 and the second connector member 49 is connected to the electronic processing unit 43. The second connector member 49 is configured to be engaged with the first connector member 29 when the auxiliary module 40 is mounted to the base module 20 to thereby allow the electronic processing unit 43 to receive measuring signals from the measuring circuits 25, 26 of the measuring unit 24 via the first and second connector members 29, 49.

In the embodiment illustrated in FIG. 1, the monitoring device 10 comprises a field probe 61, which is connected to ground and configured to generate an electric current under the influence of the electric field of the power network to which the surge arrester 1 is connected. In this case, the monitoring device 10 comprises a third measuring circuit 45 for measuring the electric current generated by the field probe 61, i.e. the electric current flowing between the field probe 61 and ground, and producing measuring signals representing the measured electric current. The electronic processing unit 43 is configured to produce monitoring data representing the electric current measured by the third measuring circuit 45. The data storage medium 44 is configured to store the monitoring data representing the leakage current measured by the second measuring circuit 26 and the monitoring data representing the electric current measured by the third measuring circuit 45 associated to time information generated by means of a clock circuit 46 so that this monitoring data can be related to specific points of time. It is hereby, in the manner described in U.S. Pat. No. 7,005,863 B2, possible to calculate a value of the resistive leakage current through the surge arrester 1 based on the monitoring data stored in the data storage medium 44. Said clock circuit 46 may be included in the auxiliary module 40 and for instance form part of the electronic processing unit 43, as illustrated in FIG. 1. As an alternative, the auxiliary module 40 may receive time information from an external clock circuit through a wireless connection or a cable connection.

The field probe 61 may consist of a plate of electrically conductive material, such as aluminium. The field probe 61 is to be located at a place where the electric field from the power network is sufficiently strong, and it should have a relatively large surface in order to be able to be effectively influenced by said electric field. The field probe 61 is with advantage provided in a separate module 60, which is connected to the auxiliary module 40 by means of an electric cable 62, as illustrated in FIGS. 1 and 8. The field probe 61 may be connected to ground via the electronic processing unit 43, as illustrated in FIG. 1. In this case, the above-mentioned third measuring circuit 45 is included in the auxiliary module 40. As an alternative, the field probe 61 may be connected to the base module 20 by means of an electric cable. In the latter case, the above-mentioned third measuring circuit 45 may be included in the base module 20. The field probe 61 is with advantage enclosed in a protective casing 63.

In the examples illustrated in FIGS. 7 and 8, the surge arrester 1 is vertically arranged and rests on one or more insulating members 3, which in their turn are supported on a stand 4. The base module 20 of the monitoring device 10 is mounted to the stand 4. The grounding line 23 of the base module 20 is connected to the surge arrester 1 by means of an electric cable 5 and to ground by means of another electric cable 6. If the stand 4 is of metallic material, the grounding line 23 may be connected to ground via the stand 4, as illustrated in FIGS. 7 and 8. In the example illustrated in FIG. 7, the base module 20 is used on its own, without any auxiliary module 40. In the example illustrated in FIG. 8, an auxiliary module 40 is mounted to the base module 20 and a field probe module 60 is mounted to the surge arrester 1 and connected to the auxiliary module 40 by means of an electric cable 62. As an alternative, the surge arrester 1 may be suspended from above in a suitable holder.

The auxiliary module 40 is with advantage provided with a temperature sensor 47 for measuring the ambient temperature. The electronic processing unit 43 is connected to the temperature sensor 47 in order to receive measuring signals from the temperature sensor as to the ambient temperature. The data storage medium 44 is configured to store temperature information generated by means of the temperature sensor 47 associated to time information generated by means of the clock circuit 46. Hereby, the monitoring data related to the electric current passing through the grounding line 23 and the monitoring data related to the electric current generated by the field probe 61 can be associated with the temperature that prevailed at the measuring occasion.

The auxiliary module 40 preferably comprises a communication unit 48 for wireless transmission of monitoring data stored in the data storage medium 44 to a reading unit (not shown). Hereby, a remote-controlled reading of data stored in the data storage medium 44 is possible. The communication unit 48 may be configured to communicate with the reading unit in the manner described in closer detail in U.S. Pat. No. 7,005,863 B2. The communication unit 48 may comprise a radio transceiver for communicating with the reading unit. It is of course also possible to use any other suitable technique for the wireless communication between the communication unit 48 and the reading unit. The communication unit 48 and the reading unit are suitably adapted for bi-directional communication so that the communication unit 48 of the auxiliary module 40 can transmit monitoring data to the reading unit as well as receive control instructions from the reading unit. The operation of the communication unit 48 is controlled by the electronic processing unit 43. As an alternative to wireless transmission, the transfer of monitoring data from the auxiliary module 40 and the supply of control instructions to the auxiliary module could take place via a cable, for instance an optical cable, or an optical fibre. The reading unit may be a portable, hand-held unit, which is temporarily connected to the auxiliary module 40 when a reading of monitoring data is to take place, as described in U.S. Pat. No. 7,005,863 B2. However, the auxiliary module 40 may also be permanently connected to a monitoring centre.

The auxiliary module 40 also comprises a power supply unit 50, which is responsible for the supply of electric current to the electronic processing unit 43, the data storage medium 44, the communication unit 48, the second measuring circuit 26 and any other possible component of the monitoring device 10 that requires supply of electric current. In the illustrated embodiment, the power supply unit 50 is connected to the second measuring circuit 26 via the first and second connector members 29, 49. The power supply unit 50 preferably comprises an energy storage member 51, for instance in the form of a supercapacitor, and one or more solar cells 52 connected to the energy storage member. As an alternative, the power supply unit 50 may consist of a simple lithium battery or the similar. In the embodiment illustrated in FIGS. 5 and 6, two solar cells 52 are provided on the front side 53 of the auxiliary module 40. The components of monitoring device 10 may, as an alternative, be supplied with electric current by cable from an external power source. In the latter case, no power supply unit is needed in the monitoring device 10.

Figure 2:
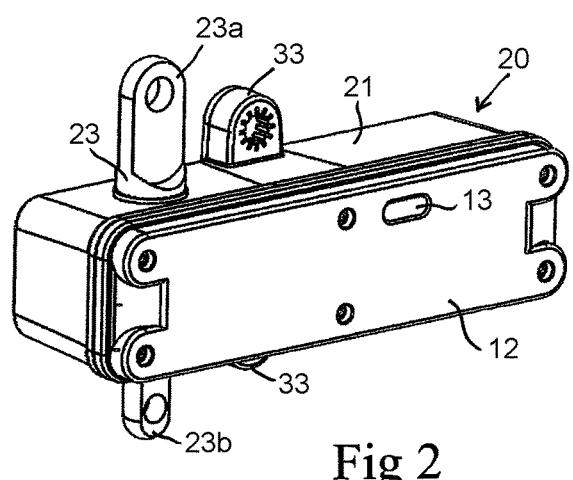
FIG. 2 is a perspective view of a base module included in a monitoring device according to an embodiment of the invention, with a cover provided on the front side of the base module.
Figure 3:
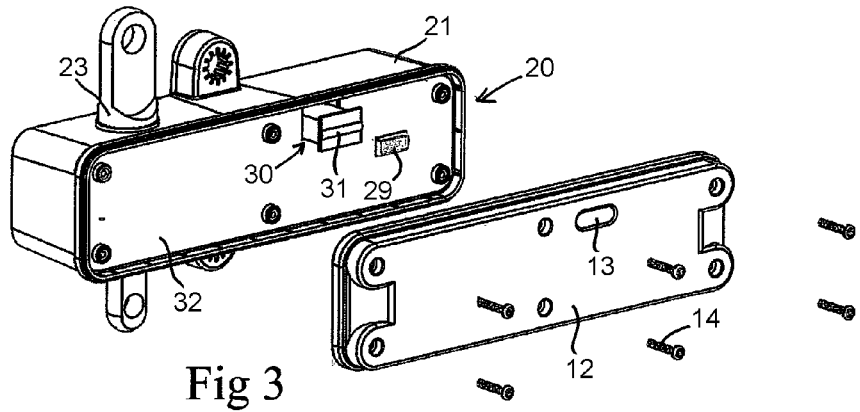
FIG. 3 is a perspective view of the base module of FIG. 2, with the cover separated from the base module.

In the illustrated embodiment, the base module 20 comprises a counter mechanism 30 for recording and displaying the number of current pulses detected by the first measuring circuit 25. The counter mechanism 30 is actuated under the effect of the electric charge of the detected current pulses. The counter mechanism 30 is provided with a conventional numerical display 31 formed by one or more digit wheels or the similar, which shows the number of detected current pulses and which is stepped forward one step at a time when a current pulse is detected by the first measuring circuit 25. The counter mechanism 30 is connected to the above-mentioned capacitor of the first measuring circuit 25 so as to allow the numerical display to be stepped forward one step when the capacitor is discharged. Thus, the counter mechanism 30 operates without requiring any supply of electric current from a power supply unit. Hereby, the base module 20 may be used on its own, without the auxiliary module 40, for a simple counting of the number of surges in the power network, as illustrated in FIGS. 2 and 7. In the embodiment illustrated in FIGS. 2-7, the numerical display 31 of the counter mechanism 30 and the above-mentioned first connector member 29 are provided on a front side 32 of the base module 20. When the base module 20 is used on its own, without any auxiliary module 40 mounted to the base module, a cover 12 may be mounted to the front side 32 of the base module 20, as illustrated in FIG. 2. The cover 12 protects the first connector member 29 and is provided with an opening 13, through which the numerical display 31 is visible. The cover 12 is detachably mounted to the casing 21 of the base module 20 by means of fastening members 14 in the form of screws. When the auxiliary module 40 is to be mounted to the base module 20, the cover 12 is removed and the auxiliary module 40 is mounted to the front side 32 of the base module 20, as illustrated in FIGS. 3-6. The above-mentioned second connector member 49 is provided on the rear side 54 of the auxiliary module 40 and is engaged with the first connector member 29 when the auxiliary module 40 is mounted to the base module 20. In the illustrated example, the numerical display 31 of the counter mechanism 30 is covered by the auxiliary module 40 when the auxiliary module is mounted to the base module 20.

In the embodiment illustrated in FIGS. 2-8, the casing 21 of the base module 20 is provided with mounting lugs 33, through which the base module 20 may be secured to the stand 4 of a surge arrester by means of fastening members in the form of bolts or the similar.

The invention is of course not in any way restricted to the embodiments described above. On the contrary, many possibilities to modifications thereof will be apparent to a person with ordinary skill in the art without departing from the basic idea of the invention such as defined in the appended claims.

The invention claimed is:

1. A monitoring device for monitoring a surge arrester connected to a power network, the monitoring device comprising:
    a grounding line, which is configured to be electrically connected to ground and to the surge arrester so that an electric current flowing through the surge arrester will pass through this grounding line;
    a measuring unit comprising one or more analog measuring circuits configured to measure the electric current passing through the grounding line and producing measuring signals related to the measured electric current;
    an electronic processing unit configured to receive said measuring signals from the measuring circuits of the measuring unit and produce monitoring data based on these measuring signals; and
    a data storage medium configured to store monitoring data produced by the electronic processing unit,
    wherein:
    the monitoring device comprises a base module and an auxiliary module detachably mountable to the base module;
    the grounding line and the measuring unit are arranged in the base module;
    the electronic processing unit and the data storage medium are arranged in the auxiliary module;
    the base module comprises a first connector member, which is connected to the measuring unit; and
    the auxiliary module comprises a second connector member, which is connected to the electronic processing unit, the second connector member being configured to be engaged with the first connector member when the auxiliary module is mounted to the base module to thereby allow the electronic processing unit to receive said measuring signals from the measuring unit via the first and second connector members.

2. The monitoring device according to claim 1, wherein the measuring unit comprises an analog measuring circuit, here denominated first measuring circuit, for detecting an electric current pulse of a predetermined magnitude in the grounding line and producing a measuring signal representing such a current pulse.

3. The monitoring device according to claim 2, wherein said first measuring circuit comprises an inductive sensing member for sensing the electric current passing through the grounding line, this sensing member comprising a coil arranged around the grounding line.

4. The monitoring device according to claim 2, wherein the base module comprises a counter mechanism for recording and displaying the number of current pulses detected by the first measuring circuit, the counter mechanism being actuated under the effect of the electric charge of the detected current pulses.

5. The monitoring device according to claim 2, wherein:
    the electronic processing unit is configured to produce monitoring data representing the current pulses detected by the first measuring circuit; and
    the data storage medium is configured to store this monitoring data.

6. The monitoring device according to claim 1, wherein the auxiliary module comprises a communication unit for wireless transmission of monitoring data stored in the data storage medium.

7. The monitoring device according to claim 1, wherein the auxiliary module comprises a power supply unit, which preferably comprises an energy storage member and one or more solar cells connected to the energy storage member.

8. The monitoring device according to claim 1, wherein the measuring unit comprises an analog measuring circuit, here denominated second measuring circuit, for measuring the leakage current of the surge arrester and producing measuring signals representing the measured leakage current.

9. The monitoring device according to claim 8, wherein said second measuring circuit comprises an inductive sensing member for sensing the electric current passing through the grounding line, this sensing member comprising a coil arranged around the grounding line.

10. The monitoring device according to claim 8, wherein:
the electronic processing unit is configured to produce monitoring data representing the leakage current measured by the second measuring circuit; and
the data storage medium is configured to store this monitoring data.

11. The monitoring device according to claim 10, wherein:
the monitoring device comprises a field probe, which is configured to generate an electric current under the influence of the electric field of the power network to which the surge arrester is connected;
the monitoring device comprises a measuring circuit, here denominated third measuring circuit, for measuring the electric current generated by the field probe and producing measuring signals representing the measured electric current;
the electronic processing unit is configured to produce monitoring data representing the electric current measured by the third measuring circuit; and
the data storage medium is configured to store the monitoring data representing the leakage current measured by the second measuring circuit and the monitoring data representing the electric current measured by the third measuring circuit associated to time information generated by means of a clock circuit included in the auxiliary module or received from an external clock circuit.

12. The monitoring device according to claim 11, wherein the auxiliary module comprises a temperature sensor for measuring the ambient temperature, the data storage medium being configured to store temperature information generated by means of the temperature sensor associated to time information generated by means of the clock circuit.

13. The monitoring device according to claim 11, wherein the field probe is provided in a separate field probe module, which is connected to the base module or the auxiliary module by means of an electric cable.

14. A surge arrester system comprising a surge arrester connected to a power network, characterized in that the surge arrester system comprises a monitoring device comprising:
a grounding line, which is configured to be electrically connected to ground and to the surge arrester so that an electric current flowing through the surge arrester will pass through this grounding line;
a measuring unit comprising one or more analog measuring circuits configured to measure the electric current passing through the grounding line and producing measuring signals related to the measured electric current;
an electronic processing unit configured to receive said measuring signals from the measuring circuits of the measuring unit and produce monitoring data based on these measuring signals; and
a data storage medium configured to store monitoring data produced by the electronic processing unit, wherein:
the monitoring device comprises a base module and an auxiliary module detachably mountable to the base module;
the grounding line and the measuring unit are arranged in the base module;
the electronic processing unit and the data storage medium are arranged in the auxiliary module;
the base module comprises a first connector member, which is connected to the measuring unit;
the auxiliary module comprises a second connector member, which is connected to the electronic processing unit, the second connector member being configured to be engaged with the first connector member when the auxiliary module is mounted to the base module to thereby allow the electronic processing unit to receive said measuring signals from the measuring unit via the first and second connector members; and
a first end of the grounding line included in the base module of the monitoring device being electrically connected to the surge arrester and an opposite second end of the grounding line being electrically connected to ground so that an electric current flowing from the power network to ground via the surge arrester will pass through the grounding line.

15. The system according to claim 14, wherein:
the surge arrester is vertically arranged and rests on one or more insulating members, which in turn are supported on a stand;
in the monitoring device the field probe is provided in a separate field probe module, which is connected to the base module or the auxiliary module by means of an electric cable;
the base module of the monitoring device is mounted to the stand; and
the field probe module of the monitoring device is mounted to the surge arrester.

* * * * *